(12) United States Patent
Mun et al.

(10) Patent No.: US 6,818,569 B2
(45) Date of Patent: Nov. 16, 2004

(54) METHOD OF FABRICATING ANNEALED WAFER

(75) Inventors: Young-Hee Mun, Gumi (KR); Gun Kim, Gumi (KR); Sung-Ho Yoon, Gumi (KR)

(73) Assignee: Siltron Inc., Gumi (KR)

(*) Notice: Subject to any disclaimer, the term of this patent is extended or adjusted under 35 U.S.C. 154(b) by 20 days.

(21) Appl. No.: 10/323,733

(22) Filed: Dec. 20, 2002

(65) Prior Publication Data

US 2004/0029403 A1 Feb. 12, 2004

(30) Foreign Application Priority Data

Aug. 6, 2002 (KR) .................. 10-2002-0046299

(51) Int. Cl.[7] .................................. H01L 21/26
(52) U.S. Cl. .................. 438/799; 438/795; 438/796; 117/3
(58) Field of Search ................ 438/795, 799, 438/796; 117/3

(56) References Cited

U.S. PATENT DOCUMENTS 6,413,310 B1 * 7/2002 Tamatsuka et al. ............ 117/3
6,551,398 B2 * 4/2003 Abe et al. .................... 117/3
6,566,255 B2 * 5/2003 Ito ............................ 438/660

FOREIGN PATENT DOCUMENTS

JP       2002-100634      4/2002   ......... H01L/21/324
WO    WO 01/73838 A1    10/2001  ......... H01L/21/324

* cited by examiner

Primary Examiner—John F. Niebling
Assistant Examiner—Jennifer M. Kennedy
(74) Attorney, Agent, or Firm—Piper Rudnick LLP

(57) ABSTRACT

A method of fabricating an annealed wafer of high quality by forming a defect-free active region of a device and controlling an irregular resistivity characteristic. The method includes a first annealing step of pre-heating a silicon wafer at a temperature of about 500° C. in a furnace in an ambience of a gas selected from the group consisting of Ar, $N_2$ and an inert gas including Ar and $N_2$; a second annealing step of changing the ambience of the gas into a 100% $H_2$ gas ambience, increasing the temperature to 850° C.–1,150° C., and carrying out annealing for about an hour by maintaining the increased temperature; a third annealing step of changing the ambience of the gas into a 100% Ar gas ambience, increasing the temperature to about 1,200° C., and carrying out annealing for about an hour while the temperature of about 1,200° C. is maintained; and a temperature dropping step of decreasing the temperature in the furnace below about 500° C.

2 Claims, 5 Drawing Sheets

Fig.1 - Prior Art
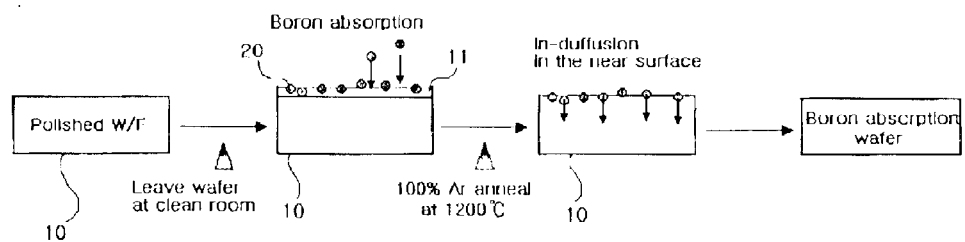
Fig. 2 - Prior Art
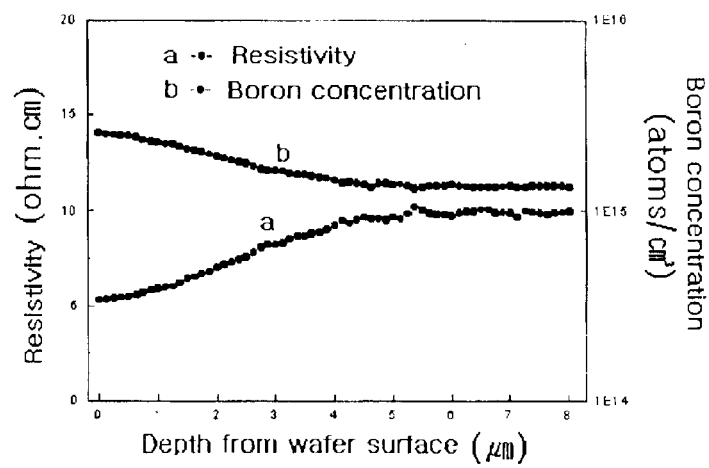

Fig. 3 - Prior Art
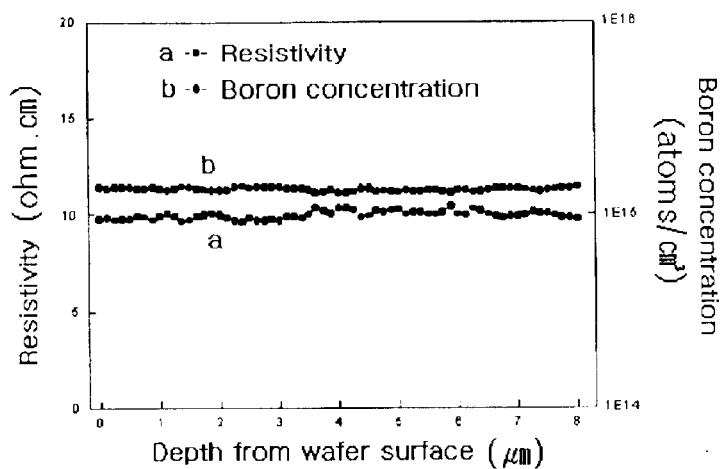
Fig. 4
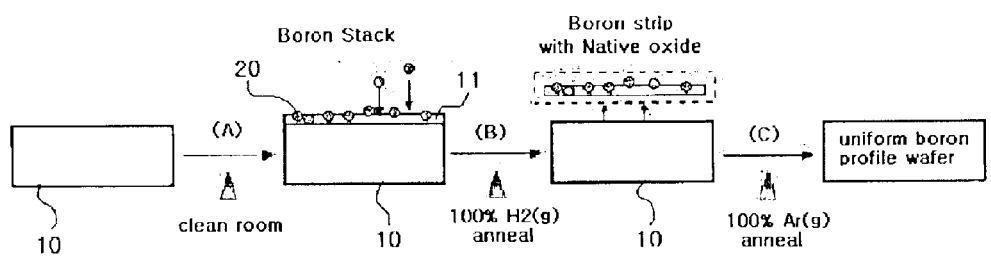

METHOD OF FABRICATING ANNEALED WAFER

BACKGROUND OF THE INVENTION

1. Field of the Invention

The present invention relates to a method of fabricating an annealed wafer and, more particularly, to a method of fabricating an annealed wafer of high quality by forming a defect-free active region of a device and controlling an irregular resistivity characteristic.

2. Background of the Related Art

Generally, a silicon wafer is prepared by growing a single crystalline silicon ingot and forming a wafer therefrom through slicing, etching, and polishing processes carried out on the single crystalline silicon ingot. Grown-in defects generated from growing the single crystalline silicon are eliminated from the silicon wafer in order to provide a device active region that is free of defects as well as form a highly concentrated oxygen defect layer in the silicon wafer, for which high temperature annealing is essentially carried out at about at least 1,200° C. for a predetermined time in an Ar ambience. Yet, if the high temperature annealing is carried out in the Ar ambience, as shown in FIG. 1, boron (B) atoms 20 are absorbed in the surface of the silicon wafer 10 when left in a clean room for a predetermined time. The boron atoms penetrate the silicon wafer 10 while a high thermal treatment is carried out at about 1,200° C. for a predetermined time in the ambience of Ar gas in the course of annealing the silicon wafer. Namely, as shown in FIG. 2, the concentration b of boron reaches a maximum level at the surface of the silicon wafer, and the concentration b of the boron atoms becomes irregular due to the diffusion of the boron atoms from the surface of the silicon wafer to a depth therein of about 5 $\mu$m. Hence, a minimum resistivity a of the silicon wafer exists at the surface of the silicon wafer, and becomes irregular from the surface of the silicon wafer to a depth therein of about 5 $\mu$m.

In order to overcome such a problem, the related art uses a method of re-polishing the surface of an annealed wafer or a HF-cleaning method of eliminating boron atoms by cleaning the silicon wafer with HF solution right before high temperature annealing in an Ar gas ambience. However, the re-polishing method grinds the irregular resistivity layer to leave a uniform resistivity layer only, whereby a denuded zone (DZ) and a COP-free region are reduced in thickness. Hence, it is difficult to provide a product that meets user's specification. Regarding the characteristics of the boron concentration b and resistivity a of the annealed wafer on which Ar annealing is carried out after the HF-cleaning, as shown in FIG. 3, such characteristics seem to be very uniform, but contamination of the HF solution may occur in such a case. Hence, an ultra-pure HF solution is required. Besides, additional processes such as re-polishing, HF cleaning, and the like are further carried out as well as the annealing, thereby increasing the product cost.

Japanese Patent Laid-Open Publication No. P2002–100634A (Apr. 5, 2002) proposes a solution overcoming the problem of the related art. It teaches that high temperature annealing is carried out in Ar gas after thermal treatment is carried out using a mixed gas of $H_2$ and Ar. Yet, if a concentration of $H_2$ gas exceeds a predetermined quantity to be mixed with oxygen, explosion may occur. Hence, the method disclosed by Japanese Patent Laid-Open Publication No. P2002-100634A mixes $H_2$ with Ar as inert gas. In this case, a concentration rate of $H_2$ is limited to an amount below about 3–4%. Since the concentration of $H_2$ is extremely small to mix, the silicon wafer should be annealed for a long time. Hence, an efficiency of the annealing process for fabricating the annealed wafer is reduced.

SUMMARY OF THE INVENTION

Accordingly, the present invention is directed to a method of fabricating an annealed wafer that substantially obviates one or more of the problems due to limitations and disadvantages of the related art.

The object of the present invention is to provide a method of fabricating an annealed wafer of high quality, which has a uniform resistivity due to a uniform boron concentration in the surface of a defect-free silicon wafer, enabling annealing efficiency of the silicon wafer to be improved as well as reducing product cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages, and in accordance with the purpose of the present invention as embodied and broadly described, a method of fabricating an annealed wafer includes a first annealing step of pre-heating a silicon wafer at a temperature of about 500° C. in a furnace in an ambience of a gas selected from the group consisting of Ar, $N_2$ or an inert gas including Ar and $N_2$; a second annealing step of changing the ambience of the gas into a 100% $H_2$ gas ambience, increasing the temperature to 850° C.~1,150° C., and carrying out annealing for about an hour by maintaining the increased temperature; a third annealing step of changing the ambience of the gas into a 100% Ar gas ambience, increasing the temperature to about 1,200° C., and carrying out annealing for about an hour while a temperature of about 1,200° C. is maintained; and a temperature dropping step of decreasing the temperature in the furnace below about 500° C.

Preferably, the second annealing step includes the steps of increasing the temperature in the furnace to about 1,100° C. and carrying out the annealing for about ten minutes by maintaining the increased temperature.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 illustrates a diagram of a boron atom penetrating mechanism by Ar annealing according to a related art;

FIG. 2 illustrates a graph of resistivity and boron concentration of a wafer annealed in Ar ambience according to a related art;

FIG. 3 illustrates a graph of resistivity and boron concentration of a wafer annealed in Ar ambience after HF cleaning;

FIG. 4 illustrates a diagram of a boron atom-eliminating mechanism according to the present invention;

DETAILED DESCRIPTION OF THE PREFERRED EMBODIMENTS

Figure 5:
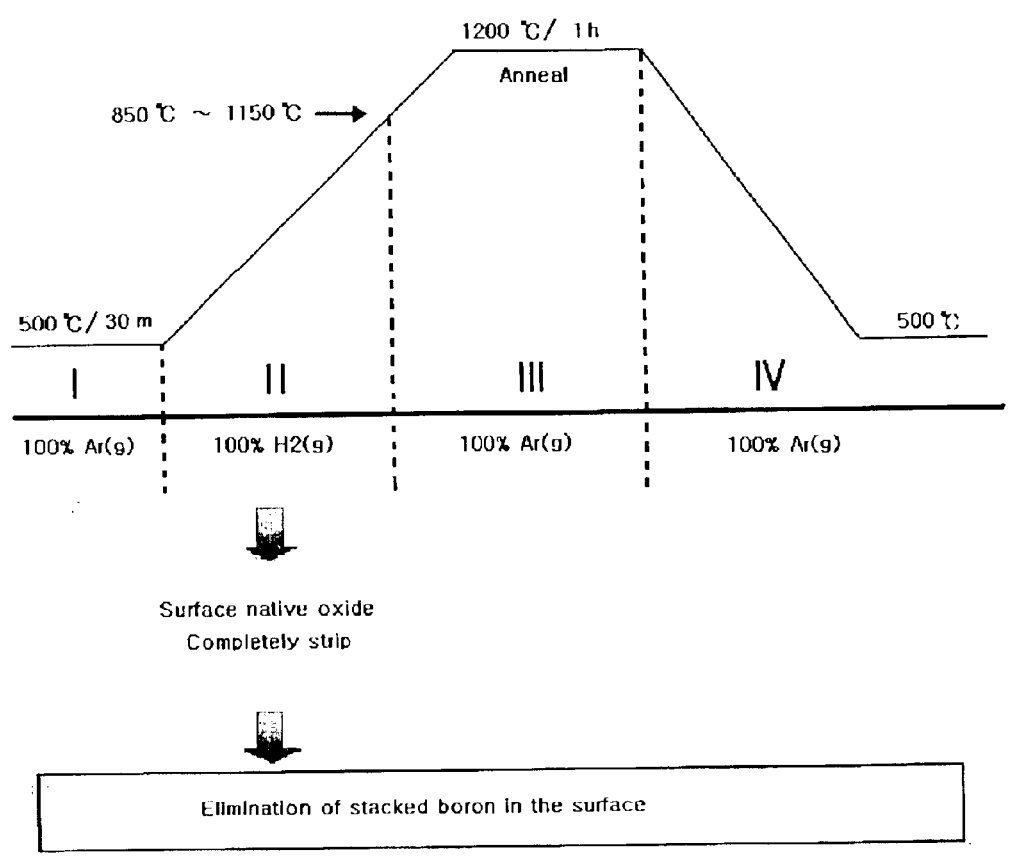
FIG. 5 and FIG. 6 illustrate graphs of annealing by a method of fabricating an annealed wafer according to the present invention.

Reference will now be made in detail to the preferred embodiments of the present invention, examples of which are illustrated in the accompanying drawings. Where possible, the same reference numerals will be used to illustrate like elements throughout the specification.

Figure 6:
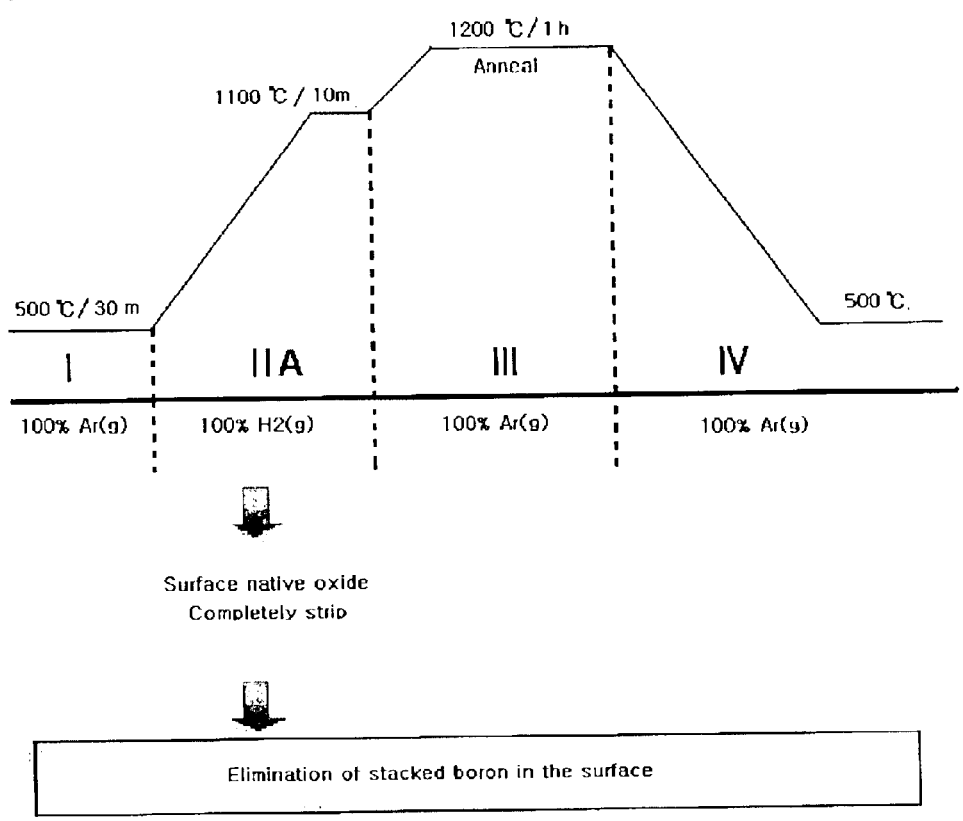
Figure 7:
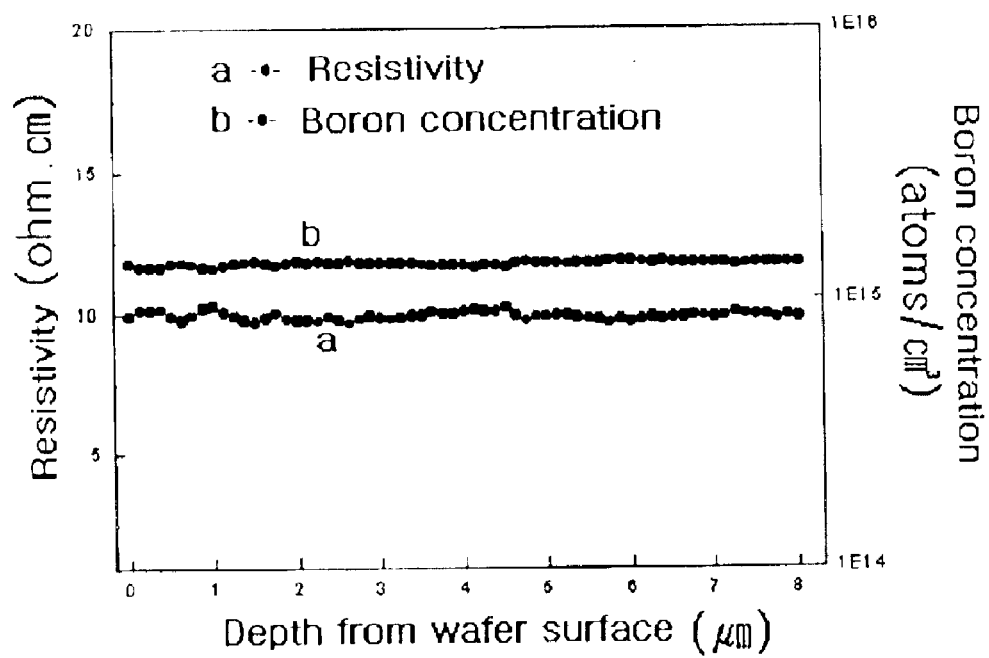
FIG. 7 illustrates a graph of resistivity and boron concentration of an annealed wafer according to the present invention.

FIG. 4 illustrates a diagram of a boron atom-eliminating mechanism according to the present invention. First of all, a silicon wafer 10 is left in a clean room (A) for a predetermined time as a pre-step for annealing. In this case, boron atoms 11 generated from an inner filter of the clean room are absorbed in native oxide on a surface of the silicon wafer 10. FIG. 5 and FIG. 6 illustrate graphs of annealing by the method of fabricating an annealed wafer according to the present invention, and FIG. 7 illustrates a graph of resistivity and boron concentration of an annealed wafer according to the present invention.

As shown in FIGS. 4 to 6, the present invention includes a first annealing step I, shown in FIG. 5 and FIG. 6, of pre-heating at about 500° C. in a gas ambience of one of the inert gases including Ar or $N_2$ gases. As shown, the pre-heating step is preferably carried out for about thirty minutes. This is a pre-heating step for preventing slip from generating from the silicon wafer in a subsequent process of annealing.

Subsequently, in order to eliminate the boron atoms 20 absorbed in the surface of the silicon wafer 10, a second annealing step II, shown in FIG. 5, for annealing by changing the gas ambience inside the furnace into 100% $H_2$ gas and increasing the temperature to about 850° C.~1,150° C. is carried out. The second annealing step II, indicated as (B) in FIG. 4, enables $H_2$ gas to react with $SiO_2$ on the surface of the silicon wafer to produce SiO(g) and $H_2O(g)$, thereby eliminating the native oxide. The boron atoms 20 absorbed in the native oxide, as shown in FIG. 4, are eliminated together with the native oxide, whereby a boron concentration in the surface of the silicon wafer 10 becomes uniform. The above-explained mechanism is expressed by the following Chemical Equation.

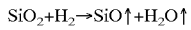

$$SiO_2 + H_2 \rightarrow SiO\uparrow + H_2O\uparrow$$

The minimum temperature in the furnace is set to 850° C., which represents the minimum enabling temperature to activate the reaction between hydrogen molecules ($H_2$) and native oxide absorbing the boron atoms in the surface of the silicon wafer. A maximum temperature in the furnace is set to 1,150° C., the limit above which metal particles are generated from an inner wall of the furnace in the $H_2$ ambience to likely cause metal contamination of the silicon wafer 20.

The second annealing step IIA, shown in FIG. 6 and also corresponding to (B) in FIG. 4, is preferably carried out for about ten minutes. This is because the resistivity in the surface of the silicon wafer 10 can be more uniform by providing the more uniform boron concentration by removing the boron atoms 20 from the surface of the silicon wafer sufficiently.

A third annealing step III, shown in FIG. 5 and FIG. 6, and indicated as (C) in FIG. 4, is then carried out for about an hour after the gas ambience in the furnace is changed into 100% Ar gas and the temperature is increased to about 1,200° C. Namely, after the boron atoms absorbed in the surface of the silicon wafer 10 are removed, high temperature annealing is carried out in the 100% Ar ambience. Hence, the problem of deceasing resistivity of the surface of the silicon wafer 10 is basically overcome by carrying out the high temperature annealing when the boron atoms 20 diffusing into the silicon wafer 10 are previously removed. Moreover, grown-in defects generated from growing single crystalline silicon in the silicon wafer 10 are eliminated.

Finally, a temperature dropping step 1V, shown in FIGS. 5 and 6, of decreasing the temperature in the furnace to a temperature below about 500° C. is carried out.

When the boron concentration and resistivity of the annealed wafer fabricated by the method of fabricating the annealed wafer according to the present invention are measured, the boron concentration b and resistivity a, as shown in FIG. 7, are uniform from the surface of the silicon wafer to a predetermined depth such as 5 $\mu$m. Such a result is very similar to the graph of resistivity and boron concentration of the wafer annealed in Ar ambience after HF cleaning in FIG. 3.

Accordingly, the method of fabricating the annealed wafer of high quality according to the present invention eliminates boron absorbed in the surface of the silicon wafer effectively in a short time without using an additional process for removing boron from the surface of the silicon wafer in the annealing process for eliminating grown-in defects in the silicon wafer, thereby enabling an annealed wafer of high quality to be produced more efficiently.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating an annealed silicon wafer with uniform boron concentration, comprising:

a first annealing step of pre-heating the silicon wafer at a temperature of approximately 500° C. in a furnace in a gas ambience consisting of one of the inert gases Ar and $N_2$;

a second annealing step of changing the ambience of the gas into a 100% $H_2$ gas ambience, increasing the temperature to approximately 1,100° C., and carrying out annealing for approximately ten minutes while maintaining the temperature of approximately 1,100° C.;

a third annealing step of changing the ambience of the gas into a 100% Ar gas ambience, increasing the temperature to approximately 1,200° C., and carrying out annealing for approximately an hour while the temperature of approximately 1,200° C. is maintained; and a temperature dropping step of decreasing the temperature in the furnace below approximately 500° C.

2. The method of claim 1, wherein the first annealing step is carried out for approximately 30 minutes.

* * * * *